(12) United States Patent
Moriya et al.

(10) Patent No.: US 10,923,150 B2
(45) Date of Patent: Feb. 16, 2021

(54) METHOD FOR PRODUCING MAGNETIC RECORDING MEDIUM

(71) Applicant: FUJI ELECTRIC CO., LTD., Kawasaki (JP)

(72) Inventors: Tomohiro Moriya, Matsumoto (JP); Hitoshi Nakata, Matsumoto (JP); Takehito Shimatsu, Sendai (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 441 days.

(21) Appl. No.: 15/723,106

(22) Filed: Oct. 2, 2017

(65) Prior Publication Data
US 2018/0040346 A1 Feb. 8, 2018

Related U.S. Application Data

(63) Continuation of application No. PCT/JP2016/002685, filed on Jun. 2, 2016.

(30) Foreign Application Priority Data

Jun. 2, 2015 (JP) ................................. 2015-112674

(51) Int. Cl.
*G11B 5/84* (2006.01)
*G11B 5/73* (2006.01)
(Continued)

(52) U.S. Cl.
CPC .......... *G11B 5/8404* (2013.01); *C23C 14/022* (2013.01); *C23C 14/024* (2013.01);
(Continued)

(58) Field of Classification Search
None
See application file for complete search history.

(56) References Cited

U.S. PATENT DOCUMENTS

| | | |
|---|---|---|
| 2004/0161638 A1 | 8/2004 | Maeda et al. |
| 2006/0002026 A1 | 1/2006 | Stipe et al. |

(Continued)

FOREIGN PATENT DOCUMENTS

| | | |
|---|---|---|
| CN | 1725303 A | 1/2006 |
| CN | 104303230 A | 1/2015 |

(Continued)

OTHER PUBLICATIONS

Translation to Takayama (JP 04-017659) published Jan. 1992.*
(Continued)

*Primary Examiner* — John J Brayton
(74) *Attorney, Agent, or Firm* — Rabin & Berdo, P.C.

(57) ABSTRACT

The purpose of the present invention is to provide a magnetic recording medium having a stacked structure of a seed layer including $(Mg_{1-x}Ti_x)O$ and a magnetic recording layer including an $L1_0$ ordered alloy, and having improved properties. The method for producing a magnetic recording layer according to the present invention includes the steps of: (1) preparing a substrate; (2) forming a seed layer including $(Mg_{1-x}Ti_x)O$ onto the substrate; (3) plasma etching the seed layer in an atmosphere including inert gas; and (4) forming a magnetic recording layer including an ordered alloy onto the seed layer which has been subjected to the step (3).

10 Claims, 16 Drawing Sheets

(51) Int. Cl.
*C23C 14/08* (2006.01)
*C23C 14/02* (2006.01)
*C23C 14/18* (2006.01)
*G11B 5/851* (2006.01)
*C23C 14/35* (2006.01)

(52) U.S. Cl.
CPC ............ *C23C 14/08* (2013.01); *C23C 14/081* (2013.01); *C23C 14/185* (2013.01); *C23C 14/35* (2013.01); *G11B 5/73* (2013.01); *G11B 5/7379* (2019.05); *G11B 5/851* (2013.01)

(56) References Cited

U.S. PATENT DOCUMENTS

| | | | |
|---|---|---|---|
| 2008/0026253 A1* | 1/2008 | Yuasa | B82Y 25/00 428/811 |
| 2012/0307398 A1 | 12/2012 | Kanbe et al. | |
| 2013/0040167 A1 | 2/2013 | Alagarsamy et al. | |
| 2014/0030552 A1* | 1/2014 | Inaba | G11B 5/66 428/828 |
| 2015/0085628 A1 | 3/2015 | Niwa et al. | |
| 2015/0162378 A1* | 6/2015 | Carey | H01L 43/10 257/421 |

FOREIGN PATENT DOCUMENTS

| | | | | |
|---|---|---|---|---|
| EP | 0772188 A1 | * | 5/1997 | ........... G11B 5/7379 |
| JP | 04017659 A | * | 1/1992 | |
| JP | H06-267054 A | | 9/1994 | |
| JP | H09-265620 A | | 10/1997 | |
| JP | 2004-178753 A | | 6/2004 | |
| JP | 2011-146089 A | | 7/2011 | |
| JP | 2011-165232 A | | 8/2011 | |
| JP | 2014-026697 A | | 2/2014 | |
| JP | 2014-081980 A | | 5/2014 | |

OTHER PUBLICATIONS

Varaprasad et al., "Electrically conductive (Mg0.2Ti0.8)O underlayer to grow FePt-based perpendicular recording media on glass substrates." Journal of Applied Physics 113, 203907 (2013) [http://dx.doi.org/10.1063/1.4804661].

S. Wicht et al., "Modification of the structural and magnetic properties of granular FePt films by seedlayer conditioning". Journal of Applied Physics 117, 013907 (2015); doi: 10.1063/1.4905422 http://dx.doi.org/10.1063/1.4905422 http://scitation.aip.org/content/aip/journal/jap/117/1?ver=pdfcov AIP Publishing.

R. F. Penoyer, "Automatic Torque Balance for Magnetic Anisotropy Measurement", The Review of Scientific Instruments, Aug. 1959, vol. 30, No. 8, pp. 711-714.

Soshin Chikazumi, "Physics of ferromagnetism vol. II", Shokabo Co., Ltd., pp. 10-21.

* cited by examiner

METHOD FOR PRODUCING MAGNETIC RECORDING MEDIUM

CROSS-REFERENCE TO THE RELATED APPLICATION

This application is a continuation application of PCT Application No. PCT/JP2016/002685 filed on Jun. 2, 2016 under 37 Code of Federal Regulation § 1.53 (b) and the PCT application claims the benefit of Japanese Patent Application No. 2015-112674 filed on Jun. 2, 2015, the above application being hereby incorporated by reference wherein in its entirety.

BACKGROUND OF THE INVENTION

Field of the Invention

The present invention relates to a magnetic recording medium. In particular, the present invention relates to a magnetic recording medium used in a hard disc magnetic recording device (HDD).

Description of the Related Art

Perpendicular magnetic recording system is adopted as a technique for achieving high-density magnetic recording. A perpendicular magnetic recording medium at least comprises a non-magnetic substrate and a magnetic recording layer formed of a hard-magnetic material. Optionally, the perpendicular magnetic recording medium may further comprise: a soft-magnetic under layer which is formed from soft-magnetic material and plays a role in concentrating the magnetic flux generated by a magnetic head onto the magnetic recording layer; an interlayer for orienting the hard-magnetic material in the magnetic recording layer in an intended direction; a protective film for protecting the surface of the magnetic recording layer; and the like.

The magnetic recording layer of the perpendicular magnetic recording medium formed of a granular magnetic material has been proposed, for the purpose of obtaining good magnetic properties. The granular magnetic material comprises magnetic crystal grains and a non-magnetic body segregated to surround the magnetic crystal grains. Respective magnetic crystal grains in the granular magnetic material are magnetically separated from each other with the non-magnetic body.

For the purpose of further increasing the recording density of the perpendicular magnetic recording medium, a need for reduction in the grain diameter of the magnetic crystal grains in the granular magnetic material arises in recent years. On the other hand, the reduction in the grain diameter of the magnetic crystal grains leads to a decrease in thermal stability of the recorded magnetization (signals). Thus, the magnetic crystal grains in the granular magnetic material need to be formed of a material with higher magnetocrystalline anisotropy, in order to compensate the decrease in thermal stability due to the reduction in the grain diameter of the magnetic crystal grains. As the material having the required higher magnetocrystalline anisotropy, Japanese Patent Laid-Open No. 2004-178753 proposes various $L1_0$ ordered alloys. Typical $L1_0$ ordered alloys include FePt, CoPt, FePd, CoPd, and the like.

It has been tried to improve the magnetic properties of the magnetic recording layer comprising the $L1_0$ ordered alloy by a layer formed under the magnetic recording layer. For example, Japanese Patent Laid-Open No. 2011-165232 proposes a magnetic recording medium in which the magnetic recording layer is formed on an interlayer comprising MgO as a principal component and one or more of additional oxides. In this proposal, reduction in the crystal grain diameter in the interlayer by addition of the additional oxides, and formation of one magnetic crystal grain in the magnetic recording layer onto one crystal grain in the interlayer (hereinafter, referred to as "one-to-one formation") allows facilitation of separation of the magnetic crystal grains, reduction in exchange coupling, and reduction in dispersion in coercive force.

Japanese Patent Laid-Open No. 2011-146089 proposes a magnetic recording medium in which a seed layer consisting of amorphous ceramics such as $SiO_2$, an orientation controlling layer consisting of a crystalline material such as MgO and $MnAl_2O_4$, and a magnetic layer comprising FePt alloy as a principal component are stacked in this order. In this proposal, the seed layer consisting of the amorphous ceramics is disposed to allow improvement in the crystalline orientation and miniaturization of the structure of the orientation controlling layer. Then, the magnetic layer having a large magnetic anisotropy constant Ku, excellent magnetic properties and excellent read/write characteristics can be obtained by suppressing disturbance in crystalline orientation of the FePt alloy in the magnetic layer and reducing the grain diameter of the magnetic crystal grains.

Alternatively, it has been tried to improve the magnetic properties of the magnetic recording layer comprising the $L1_0$ ordered alloy by surface treatment of a layer formed under the magnetic recording layer. For example, Japanese Patent Laid-Open No. 2014-081980 proposes a method for producing a magnetic recording medium comprising the steps of: exposing the surface of an interlayer consisting of CrN having a NaCl-type crystalline structure to oxygen, and subsequently forming a magnetic recording layer onto the interlayer. In this proposal, reduction in the surface roughness of the CrN interlayer caused by the exposure to oxygen allows reduction in surface roughness of the magnetic recording layer and improvement of magnetic properties of the magnetic recording layer.

One of the factors, which should be considered when intending increase in the recording density of the magnetic recording layer, is a distance between the magnetic recording layer and a magnetic head. In general, the recording density can increase, as the distance between the magnetic recording layer and the magnetic head decreases. On the other hand, the distance between the magnetic recording layer and the magnetic head must be larger than the surface roughness of the magnetic recording medium. Increase in the surface roughness of the magnetic recording medium leads to adversely influence to the flying characteristics of the magnetic head, so that the read/write characteristics of the magnetic recording medium may deteriorate. In the case of the interlayer consisting of conventionally used MgO, it is necessary to raise the substrate temperature during formation of the interlayer to not less than 400° C. for achieving the desired surface roughness. Therefore, there is a need for reducing the surface roughness of the magnetic recording medium, especially the surface roughness of the magnetic recording layer.

SUMMARY OF THE INVENTION

Further improvement in properties has been desired, also in the magnetic recording medium having a stacked structure of a seed layer comprising MgO and a magnetic recording layer comprising an $L1_0$ ordered alloy.

The method for producing a magnetic recording medium according to one embodiment comprises the steps of:
(1) preparing a substrate; (2) forming a seed layer comprising $(Mg_{1-x}Ti_x)O$ onto the substrate; (3) plasma etching the seed layer in an atmosphere comprising inert gas; and (4) forming a magnetic recording layer comprising an ordered alloy onto the seed layer which has been subjected to the step (3), wherein x is 0 or more and 0.8 or less. In the step (3), an atmosphere comprising the inert gas and oxygen may be used. Also, in the step (3), an etching amount of the seed layer is desirably 0.4 nm or more. Further, the ordered alloy may be an $L1_0$ ordered alloy. Besides, the step (1) may comprise the steps of: (1a) preparing a non-magnetic support; (1b) forming an interlayer comprising MgO; (1c) plasma etching the interlayer in an atmosphere comprising inert gas; and (1d) forming an intermediate layer onto the interlayer which has been subjected to the step (1c). Alternatively, the step (1) comprises the steps of: (1a') preparing a non-magnetic support; and (1e') forming an intermediate layer having a stacked structure of plural layers, wherein at least one of the plural layers comprises granular material. In the present specification and claims, the term "on" does not preclude intervening layers. For example, an interlayer formed on a non-magnetic support may, in some embodiments, include intervening layers between the interlayer and the non-magnetic support.

By adopting the above-described constitution, it is possible to obtain a surface having good crystallinity by etching the surface of the seed layer comprising $(Mg_{1-x}Ti_x)O$. As a result, effects such as reduction in surface roughness of the magnetic recording layer formed on the seed layer, reduction in orientation dispersion of the ordered alloy in the magnetic recording layer, and improvement in magnetic properties such as a magnetic anisotropy constant are obtained.

Further features of the present invention will become apparent from the following description of exemplary embodiments with reference to the attached drawings.

DESCRIPTION OF THE EMBODIMENTS

Figure 1:
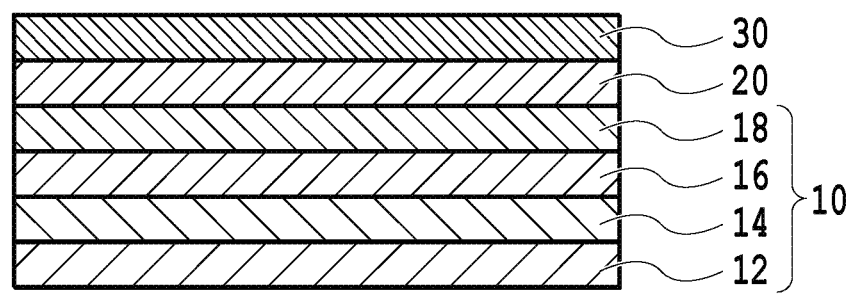
FIG. 1 is a schematic cross-sectional view showing a magnetic recording medium obtained by the production method which is one of constitutional examples of the present invention.

A method for producing a magnetic recording medium according to one embodiment comprises the steps of:
(1) preparing a substrate; (2) forming a seed layer comprising $(Mg_{1-x}Ti_x)O$ onto the substrate; (3) plasma etching the seed layer in an atmosphere comprising inert gas; and (4) forming a magnetic recording layer comprising an ordered alloy onto the seed layer which has been subjected to the step (3), wherein x is 0 or more and 0.8 or less. FIG. 1 shows a constitutional example of the magnetic recording medium produced by this method. The magnetic recording medium shown in FIG. 1 has a structure that substrate 10, seed layer 20 and magnetic recording layer 30 are stacked in this order. Besides, the substrate 10 has a structure that non-magnetic support 12, adhesive layer 14, interlayer 16, and intermediate layer 18 are stacked in this order.

The "substrate 10" prepared in the step (1) comprises the non-magnetic support 12. A stacked body in which layers known in the art such as the adhesive layer 14, a soft-magnetic under layer, a heat sink layer, the interlayer 16, and the intermediate layer 18 on the non-magnetic support 12 can be used as the "substrate 10" in the step (1).

The non-magnetic support 12 may be various substrates having a flat surface. For example, the non-magnetic support 12 may be formed of a material commonly used in magnetic recording media. The useful material comprises a NiP-plated Al alloy, monocrystalline MgO, MgAl$_2$O$_4$, SrTiO$_3$, tempered glass, crystallized glass, and the like.

The adhesive layer 14, which may be formed optionally, is used for enhancing the adhesion between the layer formed on the adhesive layer 14 and the layer formed under the adhesive layer 14. The layer formed under the adhesive layer 14 includes the non-magnetic support 12. The material for forming the adhesive layer 14 comprises a metal such as Ni, W, Ta, Cr or Ru, or an alloy containing the above-described metals. The adhesive layer 14 may be a single layer or have a stacked structure with plural layers.

The soft-magnetic under layer (not shown), which may be formed optionally, controls the magnetic flux emitted from a magnetic head to improve the read-write characteristics of the magnetic recording medium. The material for forming the soft-magnetic under layer includes: a crystalline material such as an NiFe alloy, a sendust (FeSiAl) alloy, or a CoFe alloy; a microcrystalline material such as FeTaC, CoFeNi or CoNiP; and an amorphous material including a Co alloy such as CoZrNb or CoTaZr. The optimum thickness of the soft-magnetic under layer depends on the structure and characteristics of the magnetic head used in magnetic recording. When forming the soft-magnetic under layer continuously with other layers, the soft-magnetic under layer preferably has a thickness in a range from 10 nm to 500 nm (both inclusive), in view of productivity.

A heat sink layer (not shown) may be provided when the magnetic recording medium for a heat-assisted magnetic recording system is formed by the method of this embodiment. The heat sink layer is a layer for effectively absorbing excess heat of the magnetic recording layer 30 that is generated during the heat-assisted magnetic recording. The heat sink layer can be formed of a material having a high thermal conductivity and a high specific heat capacity. Such material includes a Cu simple substance, an Ag simple substance, an Au simple substance, or an alloy material composed mainly of these substances. As used herein, the expression "composed mainly of" means that the content of the concerned material is 50% by weight or more. In consideration of its strength or the like, the heat sink layer can be formed of an Al—Si alloy, a Cu—B alloy, or the like. The function of the soft-magnetic under layer, that is, the function of concentrating a perpendicular magnetic field generated by the head to the magnetic recording layer 30, can be imparted to the heat sink layer by forming the heat sink layer of a sendust (FeSiAl) alloy, a soft-magnetic CoFe alloy, or the like. The optimum thickness of the heat sink layer depends on the amount and distribution of heat generated during the heat-assisted magnetic recording, as well as the layer configuration of the magnetic recording medium and the thickness of each constituent layer. When forming the heat sink layer continuously with other constituent layers, the heat sink layer preferably has a thickness of 10 nm or more and 100 nm or less, in view of productivity. The heat sink layer can be formed by any process known in the art, such as a sputtering method or a vacuum deposition method. As used herein, the term "sputtering method" encompasses any technique known in the art such as a DC magnetron sputtering method, and an RF magnetron sputtering method. In general cases, the heat sink layer is formed by the sputtering method. The heat sink layer can be formed just under the adhesive layer 14, just under the soft-magnetic under layer, or just under the interlayer 16, or the like, in consideration of properties required for the magnetic recording medium.

The interlayer 16 is a layer for blocking influence of the crystalline structure of the underlying layer on crystalline orientation, a size of magnetic crystal grains and the like of the magnetic recording layer 30. Further, if the soft-magnetic under layer is disposed, it is required that the interlayer 16 is non-magnetic in order to suppress magnetic influence on the soft-magnetic under layer. The material for forming the interlayer 16 includes an oxide such as MgO and SrTiO$_3$, a nitride such as TiN, a metal such as Cr and Ta, an Ni—W alloy, and a Cr-based alloy such as CrTi, CrZr, CrTa, and CrW.

The intermediate layer 18 is a layer disposed for improving the crystalline orientation of the magnetic recording layer 30, and improving the size of magnetic crystal grains in the magnetic recording layer 30. The intermediate layer 18 may have a function to take over the crystalline structure of the layer formed under the intermediate layer 18 and to reflect such structure to the magnetic recording layer 30. If the soft-magnetic under layer is disposed, the intermediate layer 18 may have a function to suppress magnetic influence of the soft-magnetic under layer to the magnetic recording layer 30. The intermediate layer 18 is preferably non-magnetic. The material for forming the intermediate layer 18 comprises a metal such as Cr, Ru, Pt and Ta, an NiW alloy, ZnO, and a Cr-based alloy such as CrTi, CrZr, CrTa, and CrW. Alternatively, the intermediate layer 18 may be formed of a granular material such as Pt—TiO$_2$ and Ru—TiO$_2$. The intermediate layer 18 may be a single layer or have a stacked structure with plural layers. In the intermediate layer 18 having the stacked structure with plural layers, at least one layer may be formed of the granular material.

The adhesive layer 14, the soft-magnetic under layer, the heat sink layer, the interlayer 16 and the intermediate layer 18, which are formed on the non-magnetic support 12, can be formed by any process known in the art, such as a sputtering method. In the case where the adhesive layer 14, the soft-magnetic under layer, the heat sink layer, the interlayer 16 or the intermediate layer 18 has the stacked structure with plural layers, the sub-steps for forming the respective layers can be carried out by any process known in the art, such as a sputtering method.

In this embodiment, in the case where the substrate 10 comprising the interlayer 16 consisting of MgO, similar etching process to the step (3) described below may be applied to the interlayer 16. However, it is desirable to adopt an etching amount of 0.2 nm or more and residual thickness of MgO after the plasma etching of 0.6 nm or more, since the thickness of the interlayer 16 is generally smaller than the thickness of the seed layer 20. The plasma etching treatment of the interlayer 16 consisting of MgO allows improvement in the crystallinity of the intermediate layer 18 formed on the interlayer 16. It is considered that the improvement in crystallinity of the intermediate layer 18 can improve properties of the seed layer 20 and the magnetic recording layer 30 which are formed above the intermediate layer 18. In this variation, the step (1) may comprise the steps of: (1a) preparing the non-magnetic support 12; (1b) forming the interlayer 16 comprising MgO; (1c) plasma etching the interlayer 16 in an atmosphere comprising inert gas; and (1d) forming the intermediate layer 18 onto the interlayer 16 which has been subjected to the step (1c). In addition, the step (1) may further comprise a step of forming the adhesive layer 14 between the steps (1a) and (1b).

This embodiment includes a variation using the substrate 10 comprising the intermediate layer 18 having the stacked structure with plural layers, wherein at least one layer constituting the intermediate layer 18 comprises a granular material. In this variation, the step (1) may comprise the steps of: (1a') preparing the non-magnetic support 12; and (1e') forming the intermediate layer 18 having a stacked structure of plural layers, wherein at least one of the plural layers comprises granular material. In addition, the step (1) may further comprise a step of (1b') forming the interlayer 16 between the steps (1a') and (1e'). Alternatively, the step (1) may further comprise a step of forming the adhesive layer 14 between the steps (1a') and (1e'). Here, if the step (1b') is present, it is desirable to carry out the step of forming the adhesive layer 14 between the steps (1a') and (1b').

In the step (2), the seed layer 20 is formed by depositing a material comprising $(Mg_{1-x}Ti_x)O$ (wherein x is 0 or more and 0.8 or less) onto the substrate 10. The function of the seed layer 20 is to control the particle diameter and crystalline orientation of the magnetic crystal grains in the magnetic recording layer 30 which is an upper layer. The seed layer 20 may have a function to ensure adhesion between the layer positioned under the seed layer 20 and the magnetic recording layer 30.

In this embodiment, $(Mg_{1-x}Ti_x)O$ constituting the seed layer 20 may have stoichiometric composition (that is, Mg+Ti:O=1:1) or non-stoichiometric composition. The compositional ratio of Mg, Ti, and O can be determined by Rutherford backscattering spectrometry (RBS). The material "$(Mg_{1-x}Ti_x)O$" in the seed layer 20 of this embodiment includes a series of compounds having a peak in a range of 2θ from 42.0° to 44.0°, in the XRD profile obtained by θ-2θ measurement in a perpendicular-to-plane direction.

Further, the seed layer 20 has a thickness of 1 nm or more and 50 nm or less, preferably 2 nm or more and 10 nm or less. The thickness within this range makes it possible to obtain the seed layer 20 having a surface with superior crystallinity after carrying out the step (3). Further, the variable x in the chemical formula of $(Mg_{1-x}Ti_x)O$ is preferably in a range of 0.2 or more and 0.8 or less. The material $(Mg_{1-x}Ti_x)O$ having the variable x within the above-described range reduces electric resistance of the target to allow adoption of a DC sputtering method. Adoption of the DC sputtering method is advantageous in improving mass productivity.

The seed layer can be formed by any process known in the art, such as a sputtering method.

In the step (3), the $(Mg_{1-x}Ti_x)O$ seed layer 20 is plasma etched in an atmosphere comprising inert gas. The "atmosphere comprising inert gas" in this step may be an atmosphere consisting of the inert gas, or an atmosphere comprising the inert gas and $O_2$. The inert gas in this embodiment comprises one or more elements selected from the group consisting of helium (He), neon (Ne), argon (Ar), krypton (Kr), xenon (Xe), and radon (Rn). Preferably, the inert gas in this embodiment is Ar. In the case using the atmosphere comprising the inert gas and $O_2$, the mole fraction of $O_2$ may be in a range of 0.06 to 0.4. Further, it is preferable to carryout the step (3) under a pressure in a range of 0.01 Pa to 10 Pa.

Plasma etching may be carried out in an exclusive apparatus for etching after transferring the stacked body comprising the substrate and the $(Mg_{1-x}Ti_x)O$ seed layer 20 to the exclusive apparatus. Alternatively, plasma etching may be carried out in a sputtering apparatus in which additional electrodes for plasma generation are attached to a substrate holder, by applying AC (alternating current) power to the additional electrodes after formation of the seed layer 20 (so-called "reverse sputtering").

It is preferable to set an etching amount of the $(Mg_{1-x}Ti_x)O$ seed layer 20 in plasma etching in the step (3) within a range of 0.2 nm or more, preferably 0.4 nm or more, and to set the residual thickness of the $(Mg_{1-x}Ti_x)O$ seed layer 20 after plasma etching within a range of 0.6 nm or more. The $(Mg_{1-x}Ti_x)O$ seed layer 20 having a surface with good crystallinity is obtained by etching within the above-described range, and the magnetic properties of the magnetic recording layer 30 which will be formed later will be improved. The obtainable effects of improvement of the magnetic properties include reduction in orientation dispersion $\Delta\theta_{50}$, reduction in coercive force in the in-plane direction Hc_in, increase in the integrated intensity of the (001) peak of an $L1_0$ ordered alloy, increase in magnetic anisotropy constant Ku, and increase in the α value of an M-H hysteresis loop. The effect of the $(Mg_{1-x}Ti_x)O$ seed layer 20, that is, control of the particle diameter and crystalline orientation of magnetic crystal grains in the magnetic recording layer 30, can be fully exerted by carrying out etching within the above-described range.

In the step (4), the magnetic recording layer 30 comprising an ordered alloy is formed onto the seed layer 20. The ordered alloy in this embodiment may be an alloy comprising at least one element selected from the group consisting of Fe and Co, and at least one element selected from the group consisting of Pt, Pd, Au and Ir. The preferable ordered alloy is an $L1_0$ ordered alloy selected from the group consisting of FePt, CoPt, FePd, and CoPd. The more preferable ordered alloy is the FePt alloy having the $L1_0$ ordered structure. The ordered alloy may further comprise at least one element selected from the group consisting of Ni, Mn, Cu, Ru, Ag, Au, and Cr.

Alternatively, the magnetic recording layer 30 may have a granular structure comprising magnetic crystal grains and a non-magnetic crystal grain boundary surrounding the magnetic crystal grains. The magnetic crystal grains may comprise the above-described ordered alloy. The non-magnetic crystal grain boundary may comprise at least one material selected from the group consisting of an oxide such as $SiO_2$, $TiO_2$ and ZnO, a nitride such as SiN and TiN, carbon (C), and boron (B). For example, the non-magnetic crystal grain boundary may comprise a mixture of carbon (C) and boron (B).

Alternatively, the magnetic recording layer 30 may consist of a plurality of magnetic layers. Each of the plurality of magnetic layers may have either of a non-granular structure or the granular structure. Further, the magnetic recording layer 30 may have an exchange-coupled composite (ECC) structure in which a coupling layer such as Ru is interposed between the magnetic layers. Further, a second magnetic layer may be disposed on the top of the magnetic layer having the granular structure, as a continuous layer not having the granular structure (CAP layer).

The step (4) can be carried out by any method known in the art, such as a sputtering method. In the case of forming the magnetic recording layer 30 comprising the ordered alloy by the sputtering method, a target comprising material for constituting the ordered alloy can be used. More specifically, a target comprising the above-described elements constituting the ordered alloy at the predetermined ratio can be used. Alternatively, the magnetic recording layer 30 may be formed by using a plurality of targets comprising a single element, and adjusting electric power applied to the respective targets to control the ratio of the elements. In the case of forming the magnetic recording layer 30 having a granular structure, a target comprising a material for forming the magnetic crystal grains and a material for forming the non-magnetic crystal grain boundary at the predetermined ratio can be used. Alternatively, the magnetic recording layer 30 may be formed by using a target comprising the material for forming the magnetic crystal grains and a target comprising the material for forming the non-magnetic crystal grain boundary, and adjusting electric power applied to the respective targets to control the constitutional ratio of the magnetic crystal grains and the non-magnetic crystal grain boundary. Here, in the case where the magnetic crystal grains are formed from the ordered alloy, a plurality of targets which separately comprise the elements constituting the ordered alloy may be used.

In the case where the magnetic recording layer 30 comprises the ordered alloy, heating of the substrate is involved during formation of the magnetic recording layer 30. The substrate temperature in this case is within a range from 300° C. to 450° C. Adoption of the substrate temperature within this range allows improvement in the order parameter of the ordered alloy in the magnetic recording layer 30.

Optionally, a protective layer (not shown) may be formed on the magnetic recording layer 30. The protective layer can be formed of a material conventionally used in the field of magnetic recording media. Specifically, the protective layer can be formed of non-magnetic metal such as Pt and Ta, a carbon-based material such as diamond-like carbon, or silicon-based material such as silicon nitride. The protective layer may be a single layer or have a stacked structure. The stacked structure of the protective layer may be a stacked structure of two types of carbon-based material having different characteristics from each other, a stacked structure of a metal and a carbon-based material, a stacked structure of two types of metals having different characteristics from each other, or a stacked structure of a metallic oxide film and a carbon-based material, for example. The protective layer can be formed by any process known in the art such as a sputtering method or a vacuum deposition method.

Further, a liquid lubricant layer (not shown) may be optionally formed onto the protective layer. The liquid lubricant layer can be formed of a material conventionally used in the field of magnetic recording media (perfluoropolyether-based lubricants or the like, for example). The liquid lubricant layer can be formed by a coating method such as a dip-coating method or a spin-coating method.

Example 1

<Step (1)>

A chemically strengthened glass substrate having a smooth surface (N-10 glass substrate manufactured by HOYA CORPORATION) was washed to prepare non-magnetic support 12. The washed non-magnetic support 12 was brought into a sputtering device to form substrate 10. Hereinafter, intermediate in the course of formation of the substrate 10 is referred to as a substrate to be deposited. Then, Ta adhesive layer 14 having a thickness of 5 nm was formed by a DC magnetron sputtering method using a Ta target disposed 180 mm apart from the substrate to be deposited in Ar gas at a pressure of 0.2 Pa. The electric power applied to the target was 200 W.

Next, an MgO interlayer 16 having a thickness of 1 nm was formed by an RF magnetron sputtering method using an MgO target disposed 180 mm apart from the substrate to be deposited in Ar gas at a pressure of 0.2 Pa. The electric power applied to the target was 200 W.

Next, Cr intermediate layer 18 having a thickness of 20 nm was formed by an RF magnetron sputtering method using a Cr target disposed 180 mm apart from the substrate to be deposited in Ar gas at a pressure of 0.2 Pa, to obtain substrate 10. The electric power applied to the target was 600 W.

<Step (2)>

Next, onto the substrate 10, MgO seed layer 20 having a thickness of 10 nm was formed by an RF magnetron sputtering method using an MgO target disposed 240 mm apart from the substrate 10 in Ar gas at a pressure of 0.18 Pa. The electric power applied to the target was 500 W. Here, the temperature of the substrate 10 was set to 450° C.

<Step (3)>

Next, the MgO seed layer 20 was subjected to plasma etching treatment in Ar gas. Here, the flow rate of the Ar gas was set to 30 sccm, and the pressure was kept to 0.1 Pa. The period of the plasma etching treatment was varied in a range from 30 seconds to 400 seconds. Besides, the RF power applied for plasma generation was 50 W.

<Step (4)>

Next, the stacked body in which the seed layer 20 had been subjected to the etching treatment was heated to a temperature of 350° C., and FePt magnetic recording layer 30 having a thickness of 10 nm was formed by an RF magnetron sputtering method using an FePt target disposed 240 mm apart from the substrate to be deposited, in Ar gas at a pressure of 0.18 Pa. The electric power applied to the FePt target was 300 W.

<Additional Step>

Subsequently, a protective layer (not shown) was formed by an RF magnetron sputtering method in Ar gas at a pressure of 0.18 Pa using a Pt target and a Ta target, to obtain a magnetic recording medium, wherein the protective layer was a stacked body of a Pt film having a thickness of 5 nm and a Ta film having a thickness of 5 nm. The substrate temperature during formation of the protective layer was room temperature (25° C.). The Pt target and the Ta target were disposed 320 mm apart from the substrate to be deposited. The sputtering power during formation of the Pt film was 100 W, and the sputtering power during formation of the Ta film was 200 W.

Example 2

A magnetic recording medium was obtained by repeating the procedure of Example 1, except that the step (3) was carried out in an atmosphere comprising Ar and $O_2$. The flow rate of $O_2$ in the step (3) was 5 sccm, and the pressure was kept at 0.14 Pa.

Comparative Example 1

A magnetic recording medium was obtained by repeating the procedure of Example 1, except that the step (3) was not carried out.

Example 3

A magnetic recording medium was obtained by repeating the procedure of Example 2, except that the step (3) was carried out in an atmosphere comprising Ar and $O_2$, the treatment time was fixed to 180 seconds, and the flow rate of $O_2$ was varied in a range from 2 to 20 sccm.

Comparative Example 2

A magnetic recording medium was obtained by repeating the procedure of Example 3, except that: an $MnCr_2O_4$ target was used instead of the MgO target and the temperature of the substrate 10 was changed to 400° C., to form an MnCr$_2$O$_4$ seed layer having a thickness of 10 nm in the step (2); and the flow rate of O$_2$ was varied in a range from 2 to 30 sccm, in the step (3).

Comparative Example 3

A magnetic recording medium was obtained by repeating the procedure of Comparative Example 2, except that the step (3) was not carried out.

Example 4

Two magnetic recording media were obtained by repeating the procedure of Example 1, except that: an Mg$_{0.5}$Ti$_{0.5}$O seed layer was formed by using an Mg$_{0.5}$Ti$_{0.5}$O target instead of the MgO target in the step (2); and the treatment time of the step (3) was set to 300 seconds.

Comparative Example 4

A magnetic recording medium was obtained by repeating the procedure of Comparative Example 4, except that the step (3) was not carried out.
(Evaluation 1)
The profile of Mg in the depth direction was measured by ESCA to determine the thickness of the MgO seed layer 20, for the sample after completion of the step (2) of Example 1, the sample to which plasma etching was carried out in the Ar gas for 1000 seconds in the step (3) of Example 1. And a sample to which plasma etching was carried out in the mixed gas of Ar and O$_2$ for 1000 seconds in the step (3) of Example 2. As a result, the etching rate was found to be 0.004 nm/second, in both of plasma etching in the Ar gas in Example 1, and plasma etching in the mixed gas of Ar and O$_2$ in Example 2.

The following evaluation was carried out for the magnetic recording medium obtained in each of Examples and Comparative Examples. A magnetization curve was measured by a vibrating sample magnetometer (VSM) to obtain coercive force in the in-plane direction Hc_in. Integrated intensities of the (001) and (002) peaks of FePt caused by FePt in the FePt magnetic recording layer 30 were measured by X-ray diffraction (XRD). Next, the (002) peak of FePt was analyzed by a rocking curve method to obtain crystalline orientation dispersion $\Delta\theta_{50}$ of the FePt magnetic recording layer 30.

The M-H hysteresis loop in the perpendicular direction of the resultant magnetic recording medium was measured with a PPMS apparatus (Physical Property Measurement System, manufactured by Quantum Design, Inc.). An $\alpha$ value of the hysteresis loop in the perpendicular direction was determined from the resultant M-H hysteresis loop. The "$\alpha$ value of the hysteresis loop" means a slope of the magnetization curve in the vicinity of the coercive force (H=Hc), and calculated by the equation of $\alpha=4\pi\times(dM/dH)$. When determining the $\alpha$ value, a unit "emu/cm$^3$" is used as the unit of M, and a unit "Oe" is used as the unit of H. Further, the magnetic anisotropy constant Ku was determined by evaluating the dependence of spontaneous magnetization on the angle at which the magnetic field is applied, by means of the PPMS apparatus. The methods described in the publications: R. F. Penoyer, "Automatic Torque Balance for Magnetic Anisotropy Measurement", The Review of Scientific Instruments, August 1959, Vol. 30, No. 8, pp. 711-714; and Soshin Chikazumi, "Physics of ferromagnetism Vol. II", Shokabo Co., Ltd., pp. 10-21 were used in determination of the magnetic anisotropy constant Ku.

Further, an area of 1 µm by 1 µm of the magnetic recording medium was observed with an atomic force microscope (AFM) to obtain an arithmetic average surface roughness Ra of the area. In these Examples and Comparative Examples, randomly selected two distinct areas were measured, and to adopt their average as the arithmetic average surface roughness Ra of the magnetic recording medium.

Figure 2A:
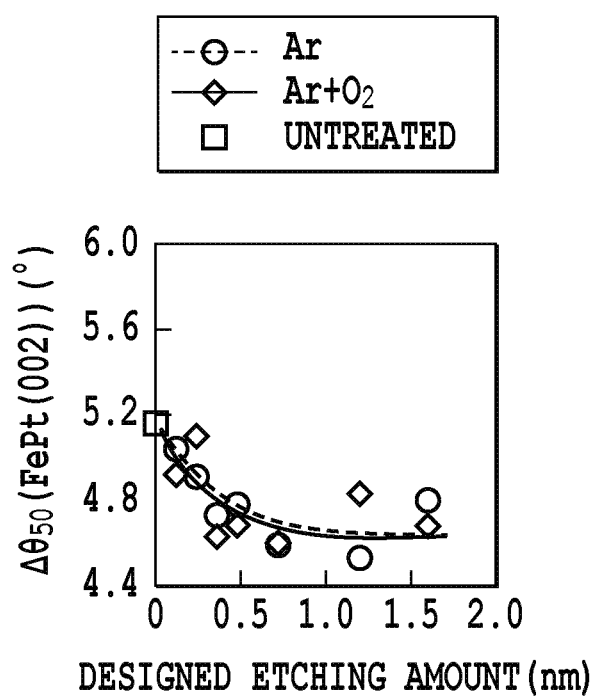
FIG. 2A is a graphical representation showing a relationship between an etching amount and orientation dispersion $\Delta\theta_{50}$, for the magnetic recording media of Example 1, Example 2, and Comparative Example 1.
Figure 2B:
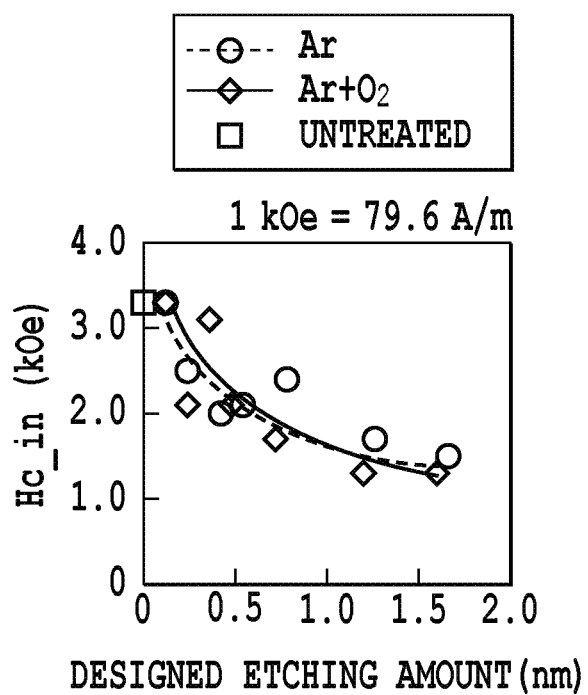
FIG. 2B is a graphical representation showing a relationship between an etching amount and coercive force in the in-plane direction Hc_in, for the magnetic recording media of Example 1, Example 2, and Comparative Example 1.
Figure 2C:
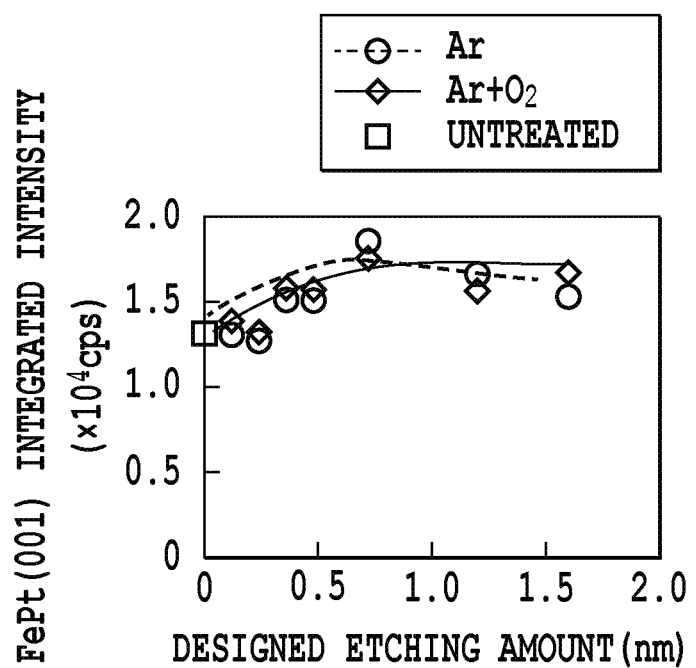
FIG. 2C is a graphical representation showing a relationship between an etching amount and integrated intensity of (001) peak of FePt in the magnetic recording layer, for the magnetic recording media of Example 1, Example 2, and Comparative Example 1.
Figure 2D:
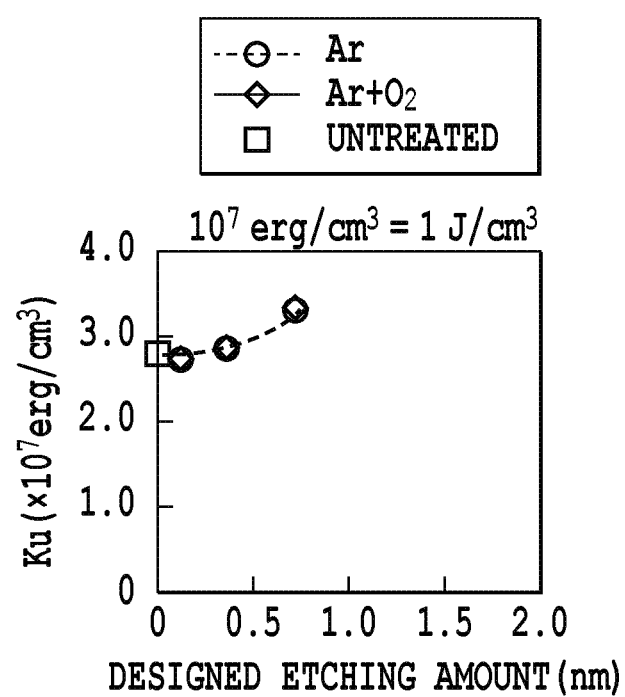
FIG. 2D is a graphical representation showing a relationship between an etching amount and a magnetic anisotropy constant Ku, for the magnetic recording media of Example 1, Example 2, and Comparative Example 1.
Figure 2E:
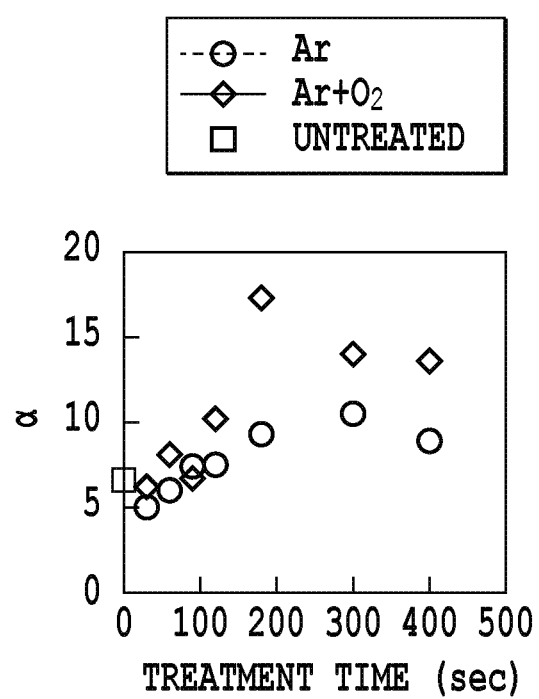
FIG. 2E is a graphical representation showing a relationship between treatment time and an α value of the M-H hysteresis loop, for the magnetic recording media of Example 1, Example 2, and Comparative Example 1.

Table 1 shows properties of the magnetic recording media of Example 1, Example 2, and Comparative Example 1. FIG. 2A is a graphical representation showing a relationship between the etching amount and the orientation dispersion $\Delta\theta_{50}$, FIG. 2B is a graphical representation showing a relationship between the etching amount and the coercive force in the in-plane direction Hc_in, FIG. 2C is a graphical representation showing a relationship between the etching amount and the integrated intensity of (001) peak of FePt in the magnetic recording layer, FIG. 2D is a graphical representation showing a relationship between the etching amount and the magnetic anisotropy constant Ku, and FIG. 2E is a graphical representation showing a relationship between the treatment time and the $\alpha$ value of the M-H hysteresis loop.

It is understood from Table 1 and FIGS. 2A-2E that the properties of the magnetic recording medium are improved in a region where the etching amount is 0.2 nm or more, especially in an area of the etching amount of 0.4 nm or more. Specifically, the following characteristics are observed, for the magnetic recording layer 30: reduction in the orientation dispersion $\Delta\theta_{50}$; reduction in the coercive force in the in-plane direction Hc_in; increase in the integrated intensity of the FePt (001) peak in the XRD analysis; increase in the magnetic anisotropy constant Ku; and increase in the $\alpha$ value of the M-H hysteresis loop. It is understood that, for $\Delta\theta_{50}$, Hc_in, the integrated intensity of the FePt (001) peak, and Ku, similar trends are obtained in Example 1 conducting plasma etching in the Ar atmosphere and in Example conducting oxidative plasma etching in the atmosphere comprising Ar and O$_2$. On the other hand, the $\alpha$ value of the M-H hysteresis loop further increases in Example 2 conducting oxidative plasma etching, even though the reason is unclear.

TABLE 1

Properties of Magnetic Recording Media of Ex. 1, Ex. 2, and C. Ex. 1

| Ex. | Treatment time (seconds) | Designed etching amount (nm) | $\Delta\theta_{5C}$ (°) | Hc_in*[1] (kOe) | XRD: Peak integrated intensity FePt (001) (×10$^4$ cps) | Ku*[2] (×10$^7$ erg/cm$^3$) | $\alpha$ |
|---|---|---|---|---|---|---|---|
| C. Ex. 1 | 0 | 0 | 5.16 | 3.3 | 1.31 | 2.80 | 6.6 |
| Ex. 1 | 30 | 0.12 | 5.04 | 3.3 | 1.31 | 2.73 | 5.0 |

TABLE 1-continued

Properties of Magnetic Recording Media of Ex. 1, Ex. 2, and C. Ex. 1

| Ex. | Treatment time (seconds) | Designed etching amount (nm) | $\Delta\theta_{50}$ (°) | Hc_in*1 (kOe) | XRD: Peak integrated intensity FePt (001) (×10⁴ cps) | Ku*2 (×10⁷ erg/cm³) | α |
|---|---|---|---|---|---|---|---|
| (Ar) | 60 | 0.24 | 4.91 | 2.5 | 1.27 | — | 6.0 |
| | 90 | 0.36 | 4.73 | 2.0 | 1.51 | 2.86 | 7.4 |
| | 120 | 0.48 | 4.78 | 2.1 | 1.51 | — | 7.5 |
| | 180 | 0.72 | 4.59 | 2.4 | 1.86 | 3.31 | 9.3 |
| | 300 | 1.20 | 4.53 | 1.7 | 1.66 | — | 10.5 |
| | 400 | 1.60 | 4.80 | 1.5 | 1.53 | — | 8.9 |
| Ex. 2 | 30 | 0.12 | 4.92 | 3.3 | 1.39 | 2.74 | 6.2 |
| (Ar + O₂) | 60 | 0.24 | 5.10 | 2.1 | 1.32 | — | 8.1 |
| | 90 | 0.36 | 4.63 | 3.1 | 1.58 | 2.87 | 6.7 |
| | 120 | 0.48 | 4.67 | 2.1 | 1.57 | — | 10.2 |
| | 180 | 0.72 | 4.60 | 1.7 | 1.76 | 3.34 | 17.3 |
| | 300 | 1.20 | 4.83 | 1.3 | 1.57 | — | 14.0 |
| | 400 | 1.60 | 4.68 | 1.3 | 1.67 | — | 13.6 |

*1 kOe = 79.6 A/mm
*2 10⁷ erg/cm³ = 1 J/cm³

Figure 3A:
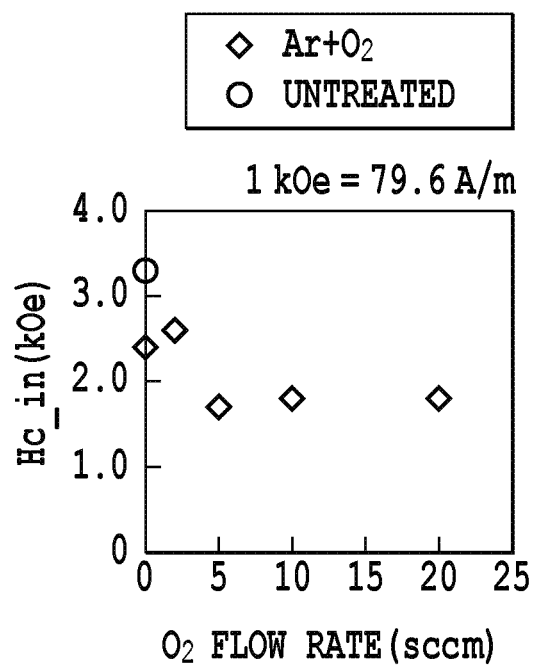
FIG. 3A is a graphical representation showing a relationship between a flow rate of oxygen and coercive force in the in-plane direction Hc_in, for the magnetic recording media of Example 3.
Figure 3B:
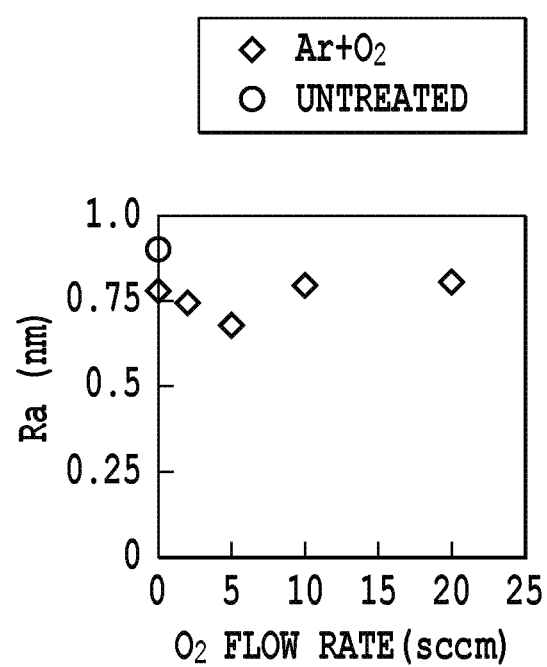
FIG. 3B is a graphical representation showing a relationship between a flow rate of oxygen and arithmetic average surface roughness Ra, for the magnetic recording media of Example 3.
Figure 3C:
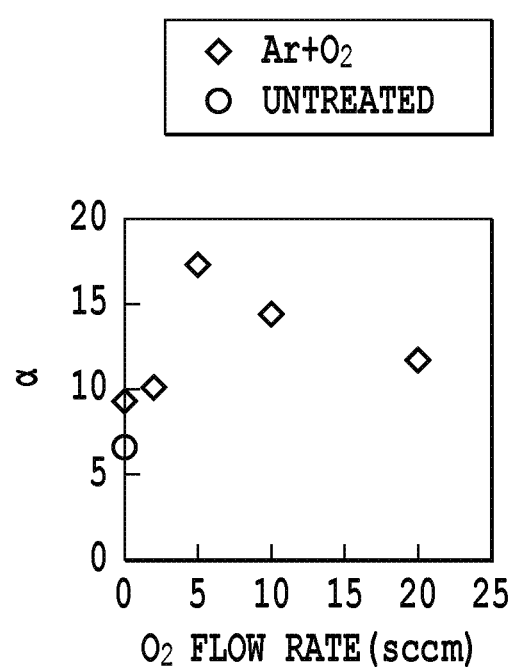
FIG. 3C is a graphical representation showing a relationship between a flow rate of oxygen and an α value of the M-H hysteresis loop, for the magnetic recording media of Example 3.

Table 2 shows properties of the magnetic recording media of Example 3. For comparison, Table 2 also shows properties of the magnetic recording media which was subjected to plasma etching for 180 seconds in Comparative Example 1 and Example 1. Further, FIG. 3A is a graphical representation showing the relationship between the flow rate of oxygen and the coercive force in the in-plane direction Hc_in, FIG. 3B is a graphical representation showing the relationship between the flow rate of oxygen and the arithmetic average surface roughness Ra, and FIG. 3C is a graphical representation showing the relationship between the flow rate of oxygen and the α value of the M-H hysteresis loop.

TABLE 2

Properties of Magnetic Recording Medium of Ex. 3

| | flow rate (sccm) | | $\Delta\theta_{50}$ (°) | Hc_in*2 (kOe) | XRD: Peak integrated intensity FePt (001) (×10⁴ cps) | Ku*3 (×10⁷ erg/cm³) | Ra (nm) | α |
|---|---|---|---|---|---|---|---|---|
| | Ar | O₂ | | | | | | |
| C. Ex. 1 | — | — | 5.16 | 3.3 | 1.31 | 2.80 | 0.902 | 6.6 |
| Ex. 1*1 | 30 | 0 | 4.59 | 2.4 | 1.86 | 3.31 | 0.780 | 9.3 |
| Ex. 3 | 30 | 2 | 4.61 | 2.6 | 1.86 | 3.36 | 0.745 | 10.1 |
| | 30 | 5 | 4.60 | 1.7 | 1.76 | 3.34 | 0.679 | 17.3 |
| | 30 | 10 | 4.93 | 1.8 | 1.60 | 3.34 | 0.796 | 14.4 |
| | 30 | 10 | 4.78 | 1.8 | 1.54 | 3.34 | 0.806 | 11.7 |

*1 Designed etching amount is 0.72 nm
*2 1 kOe = 79.6 A/mm
*3 10⁷ erg/cm³ = 1 J/cm³

As understood from Table 2, the integrated intensity of the FePt (001) peak, and Ku are not very influenced by the presence or absence of O₂ during plasma etching, and the flow rate of O₂ in a range of less than 10 sccm. On the contrary, as understood from Table 2 and FIG. 3A, Hc_in decreases as the flow rate of O₂ during plasma etching increases. Further, it is understood from Table 2, FIG. 3B and FIG. 3C that the surface roughness Ra of the magnetic recording medium decreases in an area of the flow rate of O₂ of less than 10 sccm, but increases in an area of the flow rate of O₂ of 10 sccm or more. Further, the α value of M-H hysteresis loop increases in the area of the flow rate of O₂ of less than 10 sccm, but decreases in the area of the flow rate of O₂ of 10 sccm or more. In view of the above, it is understood that the use of O₂ at the suitable flow rate during plasma etching of the step (3) is effective to improve some properties. On the other hand, it is understood that, when O₂ is used at an excessive flow rate, no improvement in properties is achieved, rather some properties deteriorate. As understood from the above-described result, it is preferable to set molar fraction of O₂ in a range of 0.06 or more and 0.4 or less, when the atmosphere comprising the inert gas and O₂ is used.

Figure 4A:
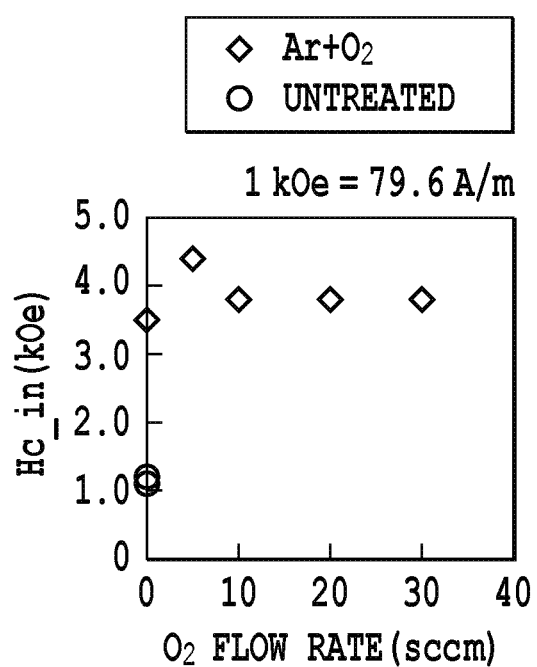
FIG. 4A is a graphical representation showing a relationship between a flow rate of oxygen and coercive force in the in-plane direction Hc_in, for the magnetic recording media of Comparative Example 2 and Comparative Example 3.
Figure 4B:
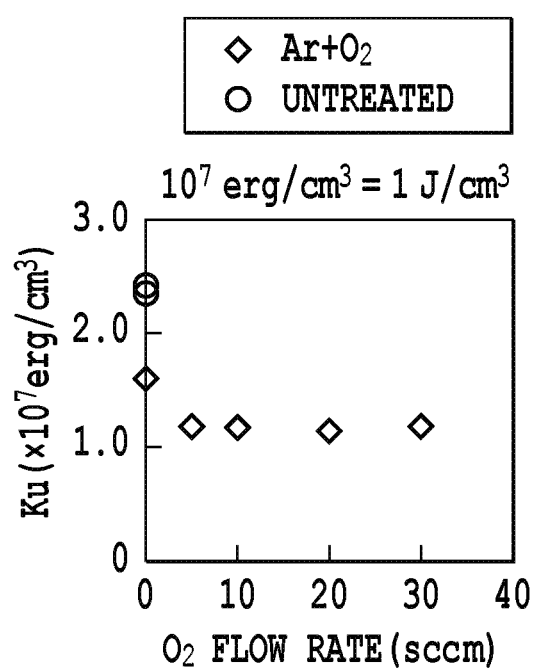
FIG. 4B is a graphical representation showing a relationship between a flow rate of oxygen and a magnetic anisotropy constant Ku, for the magnetic recording media of Comparative Example 2 and Comparative Example 3.
Figure 4C:
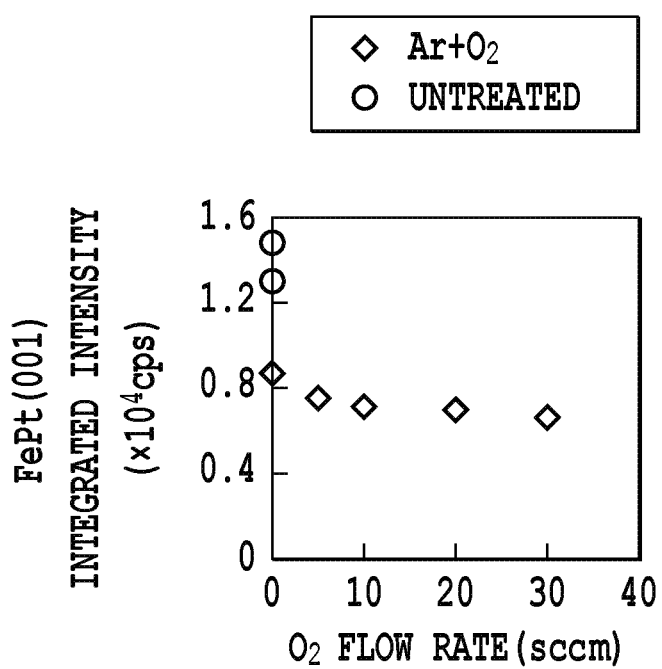
FIG. 4C is a graphical representation showing a relationship between a flow rate of oxygen and integrated intensity of (001) peak of FePt in the magnetic recording layer, for the magnetic recording media of Comparative Example 2 and Comparative Example 3.
Figure 4D:
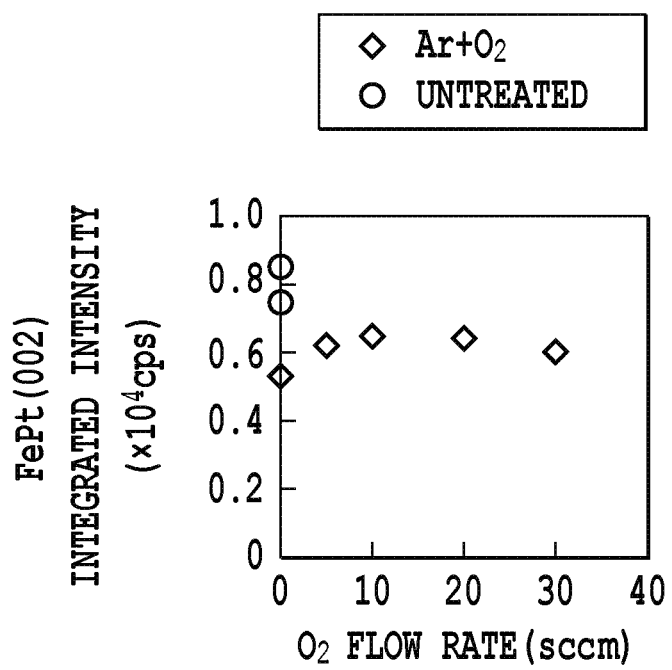
FIG. 4D is a graphical representation showing a relationship between a flow rate of oxygen and integrated intensity of (002) peak of FePt in the magnetic recording layer, for the magnetic recording media of Comparative Example 2 and Comparative Example 3.

Table 3 shows properties of the magnetic recording media of Comparative Examples 2 and 3. Further, FIG. 4A is a graphical representation showing the relationship between the flow rate of oxygen and the coercive force in the in-plane direction Hc_in, FIG. 4B is a graphical representation showing the relationship between the flow rate of oxygen and the magnetic anisotropy constant Ku, FIG. 4C is a graphical representation showing the relationship between the flow rate of oxygen and the integrated intensity of the FePt (001) peak of the magnetic recording layer, and FIG. 4D is a graphical representation showing the relationship between the flow rate of oxygen and the integrated intensity of the FePt (002) peak of the magnetic recording layer.

TABLE 3

Properties of Magnetic Recording Medium of C. Exs. 2 and 3

| | flow rate (sccm) | | Hc_in*[1] | Ku*[2] | XRD: Peak integrated intensity ($\times 10^3$ cps) | |
|---|---|---|---|---|---|---|
| | Ar | $O_2$ | (kOe) | ($\times 10^7$ erg/cm$^3$) | FePt (001) | FePt (002) |
| C. Ex 3 | — | — | 1.2 | 2.35 | 14.8 | 8.52 |
| | — | — | 1.1 | 2.42 | 13.0 | 7.47 |
| C. Ex. 2 | 30 | 0 | 3.5 | 1.60 | 8.70 | 5.31 |
| | 30 | 5 | 4.4 | 1.18 | 7.53 | 6.21 |
| | 30 | 10 | 3.8 | 1.17 | 7.13 | 6.48 |
| | 30 | 20 | 3.8 | 1.14 | 6.98 | 6.42 |
| | 30 | 30 | 3.8 | 1.18 | 6.63 | 6.02 |

*[1] 1 kOe = 79.6 A/mm
*[2] $10^7$ erg/cm$^3$ = 1 J/cm$^3$

As understood from Table 3 and FIGS. 4A-D, no improvement in properties of the magnetic recording medium is achieved by plasma etching in the Ar gas or in the mixed gas of Ar and $O_2$, in the case where the $MnCr_2O_4$ seed layer is used. Specifically, it is understood from Table 3 and FIG. 4A that the coercive force in the in-plane direction Hc_in increases. Along with this result, the magnetic anisotropy constant Ku decreases, as shown in Table 3 and FIG. 4B. Further, it is understood from Table 3, FIG. 4C and FIG. 4D that both of the integrated intensities of the FePt (001) peak the FePt (002) peak decrease.

Table 4 shows properties of the magnetic recording media of Example 4 and Comparative Example 4 which have the $Mg_{0.5}Ti_{0.5}O$ seed layer 20.

TABLE 4

Properties of Magnetic Recording Medium of Ex. 4 and C. Ex. 4

| Ex. | Treatment time (sec) | Designed etching amount (nm) | Hc_in*[2] (kOe) | XRD: Peak integrated intensity FePt (001) ($\times 10^3$ cps) | Ku*[3] ($\times 10^7$ erg/cm$^3$) | α |
|---|---|---|---|---|---|---|
| C. Ex. 4 | 0 | 0 | 6.8 | 7.74 | 0.89 | 2.3 |
| Ex. 4 | 300 | 1.2 | 4.7 | 10.1 | 1.18 | 3.1 |

*[1] 1 kOe = 79.6 A/mm
*[2] $10^7$ erg/cm$^3$ = 1 J/cm$^3$

As understood from Table 4, also in the magnetic recording medium having the $Mg_{0.5}Ti_{0.5}O$ seed layer 20, the properties of the magnetic recording medium are improved by Ar plasma etching of the $Mg_{0.5}Ti_{0.5}O$ seed layer 20. Specifically, in the magnetic recording medium of Example 4 subjected to plasma etching, reduction in the coercive force in the in-plane direction Hc_in, increase in the integrated intensity of FePt (001) peak in the XRD analysis, increase in the magnetic anisotropy constant Ku, and increase in the α value of M-H hysteresis loop are observed, in comparison with Comparative Example 4 not subjected to plasma etching.

Referential Example 1

A chemically strengthened glass substrate having a smooth surface (N-10 glass substrate manufactured by HOYA CORPORATION) was washed to prepare non-magnetic support 12. The washed non-magnetic support 12 was brought into a sputtering device. Then, Ta adhesive layer 14 having a thickness of 5 nm was formed by an RF magnetron sputtering method using a Ta target disposed 180 mm apart from the substrate to be deposited in Ar gas at a pressure of 0.2 Pa. The electric power applied to the target was 200 W.

Next, an MgO interlayer 16 having a thickness of 1 nm was formed by an RF magnetron sputtering method using an MgO target disposed 180 mm apart from the substrate to be deposited in Ar gas at a pressure of 0.2 Pa. The electric power applied to the target was 200 W.

Next, the MgO interlayer 16 was subjected to plasma etching treatment in gas comprising Ar and $O_2$. Here, the flow rates of the Ar gas and the $O_2$ gas were set to 30 sccm and 5 sccm, respectively, and the pressure was kept to 0.14 Pa. The period of the plasma etching treatment was varied in a range from 0 seconds to 400 seconds. Besides, the RF power applied for plasma generation was 50 W. Here, the period "0 seconds" means that the plasma etching treatment was not carried out.

Next, Cr intermediate layer 18 having a thickness of 20 nm was formed by an RF magnetron sputtering method using a Cr target disposed 180 mm apart from the substrate to be deposited in Ar gas at a pressure of 0.2 Pa, to obtain substrate 10. The electric power applied to the target was 600 W.

Referential Example 2

A substrate 10 was obtained by repeating the procedure of Referential Example 1, except that the thickness of the MgO interlayer 16 was changed to 2 nm.

(Evaluation 2)

The etching rate in Referential Examples 1 and 2 was 0.004 nm/second, since the plasma etching conditions are the same as those in Example 2. For the resultant substrate 10, the integrated intensity of (002) peak of Cr in the Cr intermediate layer 16 was measured by X-ray diffraction (XRD). The measured results are shown in Table 5 and FIG. 5.

TABLE 5

Properties of Substrates of R. Exs. 1 and 2

| | Thickness of Interlayer (nm) | Treatment time (sec) | Designed etching amount (nm) | XRD: Peak integrated intensity Cr (002) ($\times 10^3$ cps) |
|---|---|---|---|---|
| R. Ex. 1 | 1 | 0 | 0 | 2.59 |
| | 1 | 30 | 0.12 | 2.63 |
| | 1 | 60 | 0.24 | 3.01 |
| | 1 | 120 | 0.48 | 2.36 |
| | 1 | 180 | 0.72 | 1.79 |
| R. Ex. 2 | 2 | 0 | 0 | 2.14 |
| | 2 | 30 | 0.12 | 2.85 |
| | 2 | 60 | 0.24 | 3.49 |
| | 2 | 120 | 0.48 | 3.35 |
| | 2 | 180 | 0.72 | 2.94 |

Figure 5:
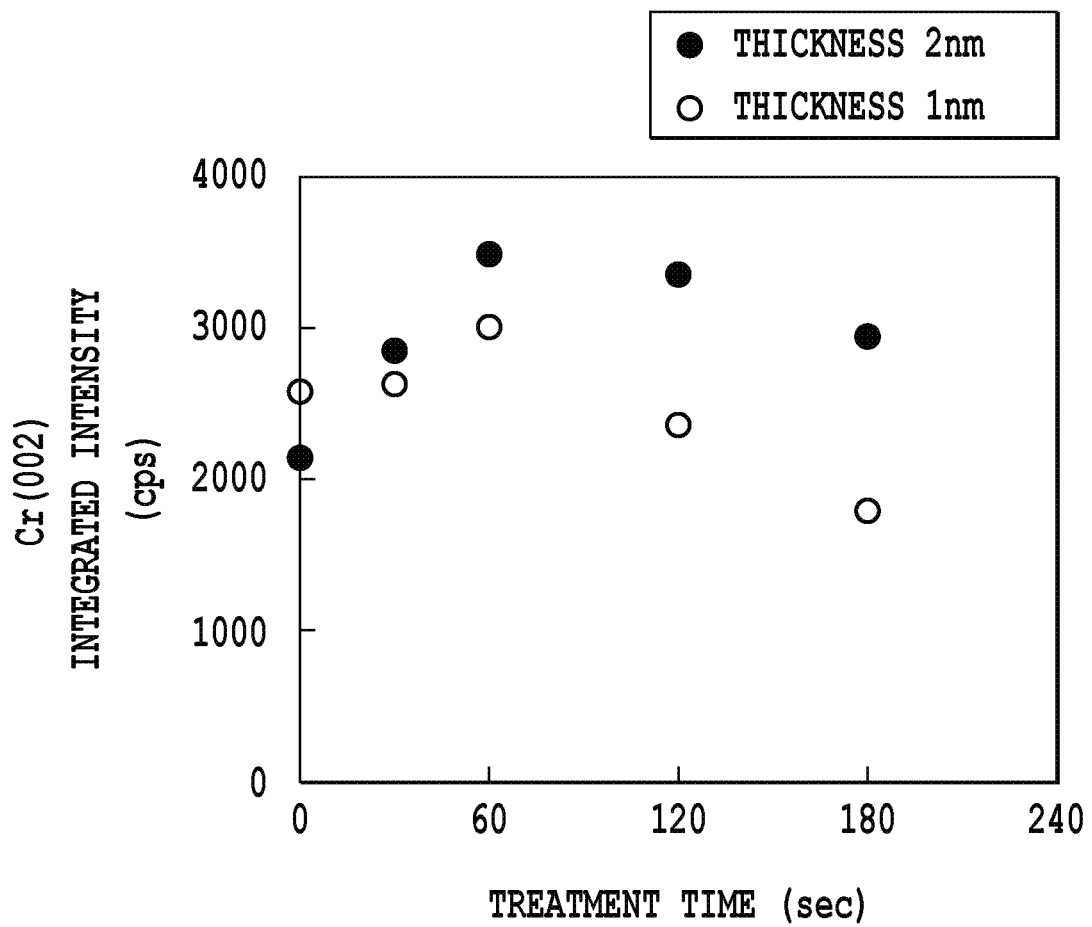
FIG. 5 is a graphical representation for showing properties of the substrate of Referential Examples 1 and 2, which shows a relationship between treatment time of the surface treatment of the interlayer and integrated intensity of (002) peak of Cr in the Cr intermediate layer.

It is understood from Table 5 and FIG. 5 that the crystallinity of the Cr intermediate layer 18, which is formed on the MgO interlayer 16, is improved by plasma etching the MgO interlayer 16 in the mixed gas comprising Ar and $O_2$. Here, it is considered that reduction in the crystallinity of the Cr intermediate layer 18 in an area of the etching amount of 0.48 nm or more in Referential Example 1 is caused by too small thickness of the MgO interlayer 16 after the treatment to exert its function of controlling the crystallinity.

Example 5

<Step (1)>

A chemically strengthened glass substrate having a smooth surface (N-10 glass substrate manufactured by HOYA CORPORATION) was washed to prepare non-magnetic support 12. The washed non-magnetic support 12 was brought into a sputtering device to form substrate 10. Hereinafter, intermediate in the course of formation of the substrate 10 is referred to as a substrate to be deposited. Then, a CrTi film having a thickness of 15 nm was formed by a DC magnetron sputtering method using a $Cr_{50}Ti_{50}$ target in Ar gas at a pressure of 0.3 Pa. Next, an RuCr film having a thickness of 5 nm was formed by a DC magnetron sputtering method using a $Ru_{70}Cr_{30}$ target in Ar gas at a pressure of 0.3 Pa, to form interlayer 16 having a stacked structure of the CrTi film and the RuCr film. The temperature of the substrate to be deposited during formation of the CrTi film and the RuCr film was room temperature (25° C.).

Next, an Ru film having a thickness of 5.9 nm was formed by a DC magnetron sputtering method using an Ru target in Ar gas at a pressure of 0.3 Pa. Then, an Ru—$TiO_2$ film having a thickness of 0.65 nm was formed by a DC magnetron sputtering method using an Ru-24 vol. % $TiO_2$ target in Ar gas at a pressure of 0.3 Pa. Next, a Pt—$TiO_2$ film having a thickness of 8 nm was formed by a DC magnetron sputtering method using a Pt-24 vol. % $TiO_2$ target in Ar gas at a pressure of 0.3 Pa. Subsequently, a ZnO film having a thickness of 2 nm was formed by an RF magnetron sputtering method using a ZnO target in Ar gas at a pressure of 0.3 Pa. As a result, substrate 10 having intermediate layer 18 was obtained, the intermediate layer 18 having the stacked structure of the Ru film, Ru—$TiO_2$ film, Pt—$TiO_2$ film and ZnO film. The temperature of the substrate to be deposited during formation of the Ru film, Ru—$TiO_2$ film, Pt—$TiO_2$ film and ZnO film was room temperature (25° C.)

<Step (2)>

Next, onto the substrate 10, MgO seed layer 20 having a thickness of 5 nm was formed by an RF magnetron sputtering method using an MgO target in Ar gas at a pressure of 0.18 Pa. The electric power applied to the target was 500 W. Here, the temperature of the substrate 10 was set to 450° C.

<Step (3)>

Next, the MgO seed layer 20 was subjected to plasma etching treatment in the mixed gas of Ar and $O_2$. Here, the flow rate of the Ar gas was set to 30 sccm, the flow rate of the $O_2$ gas was set to 5 sccm, and the pressure was kept to 0.14 Pa. The period of the plasma etching treatment was set to 180 seconds. Besides, the RF power applied for plasma generation was 50 W.

<Step (4)>

Next, the stacked body in which the seed layer 20 had been subjected to the etching treatment was heated to a temperature of 450° C., and FePt—C magnetic recording layer 30 having a thickness of 4 nm was formed by an RF magnetron sputtering method using an FePt-30 vol % C target in Ar gas at a pressure of 0.9 Pa. The electric power applied to the FePt-30 vol % C target was 300 W.

<Additional Step>

Subsequently, a protective layer (not shown), which was a stacked body of a Pt film having a thickness of 5 nm and a Ta film having a thickness of 5 nm, was formed by an RF magnetron sputtering method using a Pt target and a Ta target in Ar gas at a pressure of 0.18 Pa, to obtain a magnetic recording medium. The substrate temperature during formation of the protective layer was room temperature (25° C.).

The sputtering power during formation of the Pt film was 100 W, and the sputtering power during formation of the Ta film was 200 W.

Comparative Example 5

A magnetic recording medium was obtained by repeating the procedure of Example 5, except that the step (3) was not carried out.

(Evaluation 3)

Figure 6:
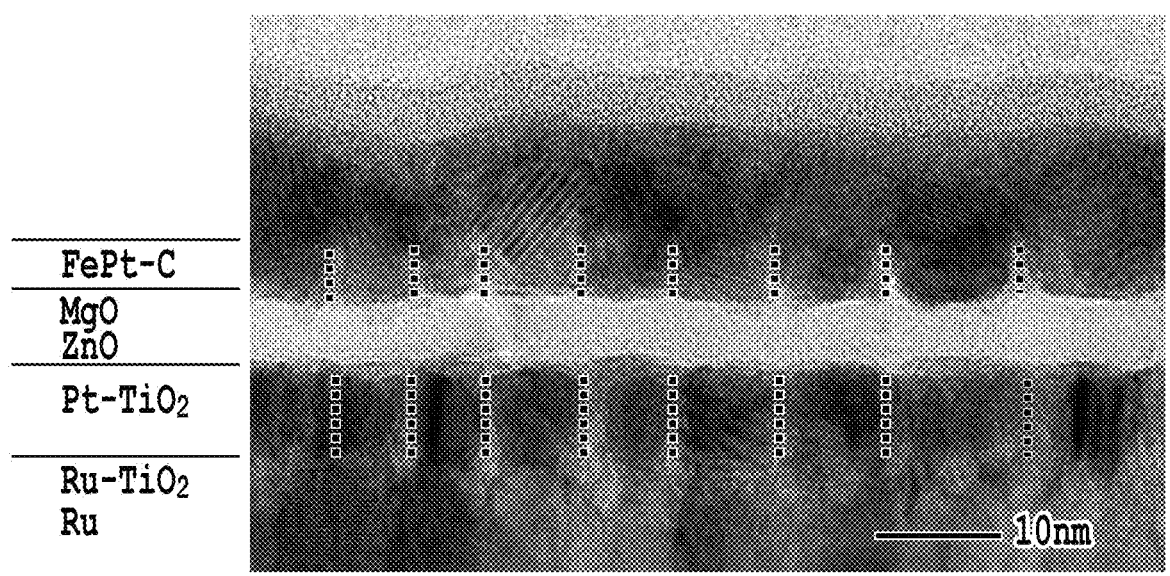
FIG. 6 is a scanning electron micrograph of the cross-section of the magnetic recording medium obtained in Example 5.
Figure 7:
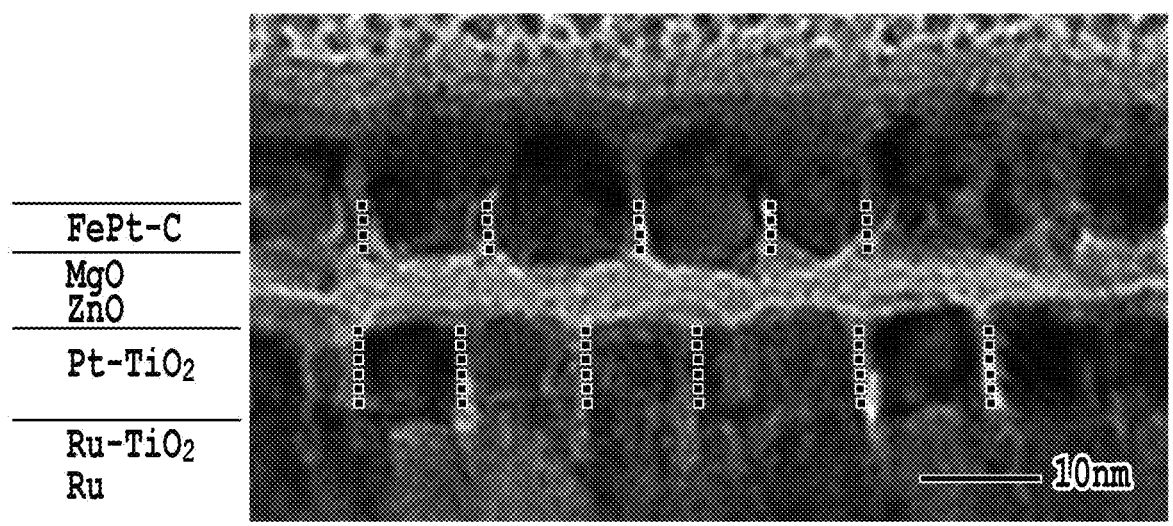
FIG. 7 is a scanning electron micrograph of the cross-section of the magnetic recording medium obtained in Comparative Example 5.

The cross-section of the magnetic recording medium obtained in Example 5 and the cross-section of the magnetic recording medium obtained in Comparative Example 5 were observed by a transmission electron microscope (TEM). FIG. 6 shows a TEM photograph of the cross-section of the magnetic recording medium obtained in Example 5, and FIG. 7 shows a TEM photograph of the cross-section of the magnetic recording medium obtained in Comparative Example 5. Besides, FIGS. 6 and 7 also show the designed layer constitutions.

As understood from FIGS. 6 and 7, in the Ru film, Ru—$TiO_2$ film, and Pt—$TiO_2$ film constituting the intermediate layer, the crystal grain boundaries of the respective films are continuous in the thickness direction. In other words, the Ru crystal grain in the Ru—$TiO_2$ film is grown on the Ru crystal grain in the Ru film in a columnar and one-to-one manner. Also, the Pt crystal grain in the Pt—$TiO_2$ film is grown on the Ru crystal grain in the Ru—$TiO_2$ film in a columnar and one-to-one manner.

On the other hand, as understood from FIG. 7, in the magnetic recording medium of Comparative Example 5 in which plasma etching of the MgO seed layer 20 in the step (3) has not been carried out, the Pt crystal grain boundary in the Pt—$TiO_2$ film constituting the intermediate layer 18 does not coincide with the FePt magnetic crystal grain boundary in the FePt—C magnetic recording layer 30, in the thickness direction. That is, the FePt magnetic crystal grain in the FePt—C magnetic recording layer 30 is not formed over the Pt crystal grain in the Pt—$TiO_2$ film in the one-to-one manner.

On the contrary, as understood from FIG. 6, in the magnetic recording medium of Example 5 in which plasma etching of the MgO seed layer 20 in the step (3) has been carried out, the Pt crystal grain boundary in the Pt—$TiO_2$ film constituting the intermediate layer 18 coincides with the FePt magnetic crystal grain boundary in the FePt—C magnetic recording layer 30, in the thickness direction. That is, the FePt magnetic crystal grain in the FePt—C magnetic recording layer 30 is formed over the Pt crystal grain in the Pt—$TiO_2$ film in the one-to-one manner.

It becomes apparent from the above results that plasma etching of the surface of the MgO seed layer 20 in the step (3) allows excellent separation of the FePt crystal grains in the FePt—C magnetic recording layer 30, by one-to-one growth which reflect the excellent crystal grain structure of the Ru film which is the bottom layer of the intermediate layer 18.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. All of the patent applications and documents cited herein are incorporated herein by reference in their all entities.

What is claimed is:

1. A method for producing a magnetic recording medium comprising:
   (1) preparing a substrate;
   (2) forming a seed layer comprising $(Mg_{1-x}Ti_x)O$ onto the substrate;
   (3) plasma etching the seed layer in an atmosphere comprising inert gas; and
   (4) forming a magnetic recording layer comprising an ordered alloy onto the seed layer which has been subjected to the plasma etching in step (3),
   wherein x is 0 or more and 0.8 or less,
   wherein plasma etching the seed layer in step (3) is performed in an atmosphere comprising the inert gas and oxygen, and
   wherein the step (2) is performed before forming any magnetic recording layer, including the magnetic recording layer in the step (4).

2. The method for producing the magnetic recording medium according to claim 1, wherein a thickness of a portion of the seed layer removed by the plasma etching in the step (3) is 0.4 nm or more.

3. The method for producing the magnetic recording medium according to claim 2, wherein a residual thickness of the seed layer after the plasma etching in step (3) is 0.6 nm or more.

4. The method for producing the magnetic recording medium according to claim 1, wherein the ordered alloy is an $L1_0$ ordered alloy.

5. The method for producing the magnetic recording medium according to claim 1, wherein the preparing the substrate in step (1) comprises:
   (1a) preparing a non-magnetic support;
   (1b) forming an interlayer comprising MgO on the non-magnetic support;
   (1c) plasma etching the interlayer in an atmosphere comprising inert gas; and
   (1d) forming an intermediate layer onto the interlayer which has been subjected to the plasma etching in step (1c).

6. The method for producing the magnetic recording medium according to claim 1, wherein the preparing the substrate in step (1) comprises:
   (1a') preparing a non-magnetic support; and
   (1e') forming an intermediate layer having a stacked structure of plural layers on the non-magnetic support,
   wherein at least one of the plural layers comprises granular material.

7. The method for producing the magnetic recording medium according to claim 1, wherein x is 0.1 or more.

8. The method for producing the magnetic recording medium according to claim 1, wherein x is 0.2 or more and 0.8 or less.

9. The method for producing the magnetic recording medium according to claim 1, wherein the atmosphere in the step (3) has a molar fraction of $O_2$ in a range of 0.06 to 0.4.

10. A method for producing a magnetic recording medium comprising:
    (1) preparing a substrate;
    (2) forming a seed layer comprising $(Mg_{1-x}Ti_x)O$ directly onto the substrate;
    (3) plasma etching the seed layer in an atmosphere comprising inert gas; and
    (4) forming a magnetic recording layer comprising an ordered alloy onto the seed layer which has been subjected to the plasma etching in step (3),
    wherein x is greater than 0 and equal to or less than 0.8, and
    wherein plasma etching the seed layer in step (3) is performed in an atmosphere comprising the inert gas and oxygen.

* * * * *